(12) United States Patent
Chen et al.

(10) Patent No.: US 10,084,037 B2
(45) Date of Patent: Sep. 25, 2018

(54) MOSFET ACTIVE AREA AND EDGE TERMINATION AREA CHARGE BALANCE

(71) Applicant: VISHAY-SILICONIX, Santa Clara, CA (US)

(72) Inventors: Qufei Chen, San Jose, CA (US); Kyle Terrill, Santa Clara, CA (US); Sharon Shi, San Jose, CA (US)

(73) Assignee: VISHAY-SILICONIX, Santa Clara, CA (US)

( * ) Notice: Subject to any disclaimer, the term of this patent is extended or adjusted under 35 U.S.C. 154(b) by 0 days.

(21) Appl. No.: 15/339,678

(22) Filed: Oct. 31, 2016

(65) Prior Publication Data
US 2017/0117354 A1 Apr. 27, 2017

Related U.S. Application Data

(62) Division of application No. 12/203,846, filed on Sep. 3, 2008, now Pat. No. 9,484,451.
(Continued)

(51) Int. Cl.
*H01L 29/66* (2006.01)
*H01L 29/06* (2006.01)
(Continued)

(52) U.S. Cl.
CPC ...... *H01L 29/0634* (2013.01); *H01L 29/1095* (2013.01); *H01L 29/167* (2013.01);
(Continued)

(58) Field of Classification Search
CPC .................. H01L 29/7811; H01L 29/7813
See application file for complete search history.

(56) References Cited

U.S. PATENT DOCUMENTS 4,641,174 A   2/1987 Baliga
4,672,407 A   6/1987 Nakagawa et al.
(Continued)

FOREIGN PATENT DOCUMENTS

CN   101154664 A   4/2008
CN   101180737 A   5/2008
(Continued)

OTHER PUBLICATIONS

"Effects on Selecting Channel Direction in Improving Performance of Sub-100 nm MOSFETs Fabricated on (110) Surface Si Substrate""Japanese Journal of Applied Physics, Part 1, vol. 43, No. 4B, Apr. 2004 pp. 1723-1728 (Nakamura et al.), XP00122768."
(Continued)

*Primary Examiner* — Julio J Maldonado
*Assistant Examiner* — Andre' C Stevenson

(57) ABSTRACT

A method for fabricating a MOSFET having an active area and an edge termination area is disclosed. The method includes forming a first plurality of implants at the bottom of trenches located in the active area and in the edge termination area. A second plurality of implants is formed at the bottom of the trenches located in the active area. The second plurality of implants formed at the bottom of the trenches located in the active area causes the implants formed at the bottom of the trenches located in the active area to reach a predetermined concentration. In so doing, the breakdown voltage of both the active and edge termination areas can be made similar and thereby optimized while maintaining advantageous RDson.

20 Claims, 10 Drawing Sheets

Related U.S. Application Data

(60) Provisional application No. 60/997,945, filed on Oct. 5, 2007.

(51) Int. Cl.
*H01L 29/78* (2006.01)
*H01L 29/40* (2006.01)
*H01L 29/167* (2006.01)
*H01L 29/10* (2006.01)

(52) U.S. Cl.
CPC .......... *H01L 29/407* (2013.01); *H01L 29/408* (2013.01); *H01L 29/66734* (2013.01); *H01L 29/7811* (2013.01); *H01L 29/7813* (2013.01)

(56) References Cited

U.S. PATENT DOCUMENTS

| | | | |
|---|---|---|---|
| 4,782,372 A | 11/1988 | Nakagawa et al. | |
| 4,799,095 A | 1/1989 | Baliga | |
| 4,823,172 A | 4/1989 | Mihara | |
| 4,827,321 A | 5/1989 | Baliga | |
| 4,857,986 A | 8/1989 | Kinugawa | |
| 4,893,160 A | 1/1990 | Blanchard | |
| 4,928,155 A | 5/1990 | Nakagawa et al. | |
| 4,939,557 A | 7/1990 | Pao et al. | |
| 4,967,243 A | 10/1990 | Baliga et al. | |
| 4,969,027 A | 11/1990 | Baliga et al. | |
| 5,021,840 A | 6/1991 | Morris | |
| 5,111,253 A | 5/1992 | Korman et al. | |
| 5,155,574 A | 10/1992 | Yamaguchi | |
| 5,191,395 A | 3/1993 | Nishimura | |
| 5,221,850 A | 6/1993 | Sakurai | |
| 5,245,106 A | 9/1993 | Cameron et al. | |
| 5,366,914 A | 11/1994 | Takahashi et al. | |
| 5,387,528 A | 2/1995 | Hutchings et al. | |
| 5,430,315 A | 7/1995 | Rumennik | |
| 5,525,821 A | 6/1996 | Harada et al. | |
| 5,527,720 A | 6/1996 | Goodyear et al. | |
| 5,567,634 A | 10/1996 | Hebert et al. | |
| 5,602,424 A | 2/1997 | Tsubouchi et al. | |
| 5,621,234 A | 4/1997 | Kato | |
| 5,648,283 A | 7/1997 | Tsang et al. | |
| 5,689,128 A | 11/1997 | Hshieh et al. | |
| 5,696,396 A | 12/1997 | Tokura et al. | |
| 5,770,878 A | 6/1998 | Beasom | |
| 5,808,340 A | 9/1998 | Wollesen et al. | |
| 5,814,858 A | 9/1998 | Williams | |
| 5,877,538 A | 3/1999 | Williams | |
| 5,965,904 A | 10/1999 | Ohtani et al. | |
| 5,998,836 A | 12/1999 | Williams | |
| 5,998,837 A | 12/1999 | Williams | |
| 6,049,108 A | 4/2000 | Williams et al. | |
| 6,140,678 A | 10/2000 | Grabowski et al. | |
| 6,153,896 A | 11/2000 | Omura et al. | |
| 6,168,996 B1 | 1/2001 | Numazawa et al. | |
| 6,172,398 B1 | 1/2001 | Hshieh | |
| 6,180,966 B1 | 1/2001 | Kohno et al. | |
| 6,204,533 B1 | 3/2001 | Williams et al. | |
| 6,211,018 B1 | 4/2001 | Nam et al. | |
| 6,245,615 B1 | 6/2001 | Noble et al. | |
| 6,268,242 B1 | 7/2001 | Williams et al. | |
| 6,277,695 B1 | 8/2001 | Williams et al. | |
| 6,285,060 B1 | 9/2001 | Korec et al. | |
| 6,323,518 B1 | 11/2001 | Sakamoto et al. | |
| 6,348,712 B1 | 2/2002 | Korec et al. | |
| 6,351,009 B1 | 2/2002 | Kocon et al. | |
| 6,359,308 B1 | 3/2002 | Hijzen et al. | |
| 6,380,569 B1 | 4/2002 | Chang et al. | |
| 6,391,721 B2 | 5/2002 | Nakagawa | |
| 6,413,822 B2 | 7/2002 | Williams et al. | |
| 6,483,171 B1 | 11/2002 | Forbes et al. | |
| 6,495,883 B2 | 12/2002 | Shibata et al. | |
| 6,580,123 B2 | 6/2003 | Thapar | |
| 6,580,154 B2 | 6/2003 | Noble et al. | |
| 6,621,122 B2 | 9/2003 | Qu | |
| 6,642,109 B2 | 11/2003 | Lee et al. | |
| 6,661,054 B1 | 12/2003 | Nakamura | |
| 6,700,158 B1 | 3/2004 | Cao et al. | |
| 6,710,403 B2 | 3/2004 | Sapp | |
| 6,717,210 B2 | 4/2004 | Takano et al. | |
| 6,756,274 B2 | 6/2004 | Williams et al. | |
| 6,764,889 B2 * | 7/2004 | Baliga ............ | H01L 21/823487 257/E21.629 |
| 6,794,239 B2 | 9/2004 | Gonzalez | |
| 6,836,001 B2 | 12/2004 | Yamauchi et al. | |
| 6,861,701 B2 | 3/2005 | Williams et al. | |
| 6,903,393 B2 | 6/2005 | Ohmi et al. | |
| 6,919,610 B2 | 7/2005 | Saitoh et al. | |
| 6,927,455 B2 | 8/2005 | Narazaki | |
| 6,960,821 B2 | 11/2005 | Noble et al. | |
| 7,361,952 B2 | 4/2008 | Miura et al. | |
| 7,375,029 B2 | 5/2008 | Poelzl | |
| 7,470,953 B2 | 12/2008 | Takaya et al. | |
| 7,504,307 B2 * | 3/2009 | Peake ............ | H01L 29/0634 257/E21.409 |
| 7,521,306 B2 | 4/2009 | Kubo et al. | |
| 7,541,642 B2 | 6/2009 | Kawamura et al. | |
| 7,601,603 B2 | 10/2009 | Yamauchi et al. | |
| 7,642,178 B2 | 1/2010 | Yamauchi et al. | |
| 7,659,588 B2 | 2/2010 | Husain et al. | |
| 7,663,195 B2 | 2/2010 | Ohmi et al. | |
| 7,700,970 B2 | 4/2010 | Saggio et al. | |
| 7,767,500 B2 | 8/2010 | Sridevan | |
| 7,811,907 B2 | 10/2010 | Shibata et al. | |
| 7,825,474 B2 | 11/2010 | Noguchi et al. | |
| 7,834,376 B2 | 11/2010 | Carta et al. | |
| 7,910,440 B2 | 3/2011 | Ohta et al. | |
| 8,080,459 B2 | 12/2011 | Xu | |
| 8,334,566 B2 | 12/2012 | Tai | |
| 8,367,500 B1 | 2/2013 | Xu et al. | |
| 8,368,165 B2 | 2/2013 | Richieri | |
| 8,629,019 B2 | 1/2014 | Xu et al. | |
| 8,633,561 B2 | 1/2014 | Husain et al. | |
| 9,412,880 B2 | 8/2016 | Carta et al. | |
| 9,419,092 B2 | 8/2016 | Carta et al. | |
| 9,443,974 B2 | 9/2016 | Gao et al. | |
| 9,478,441 B1 | 10/2016 | Sridevan | |
| 9,842,911 B2 | 12/2017 | Tipimeni et al. | |
| 2001/0005031 A1 | 6/2001 | Sakamoto et al. | |
| 2001/0026006 A1 | 10/2001 | Noble et al. | |
| 2001/0052601 A1 | 12/2001 | Onishi et al. | |
| 2002/0038887 A1 | 4/2002 | Ninomiya et al. | |
| 2002/0050847 A1 | 5/2002 | Taniguchi et al. | |
| 2002/0074585 A1 | 6/2002 | Tsang et al. | |
| 2003/0030092 A1 | 2/2003 | Darwish et al. | |
| 2003/0067033 A1 | 4/2003 | Kinoshita et al. | |
| 2003/0201483 A1 | 10/2003 | Sumida | |
| 2004/0016959 A1 | 1/2004 | Yamaguchi et al. | |
| 2004/0056284 A1 | 3/2004 | Nagaoka et al. | |
| 2004/0155287 A1 | 8/2004 | Omura et al. | |
| 2004/0161886 A1 | 8/2004 | Forbes et al. | |
| 2005/0001268 A1 | 1/2005 | Baliga | |
| 2005/0026369 A1 | 2/2005 | Noble et al. | |
| 2005/0079678 A1 | 4/2005 | Verma et al. | |
| 2005/0167695 A1 | 8/2005 | Yilmaz | |
| 2005/0184336 A1 | 8/2005 | Takahashi et al. | |
| 2006/0108635 A1 | 5/2006 | Bhalla et al. | |
| 2006/0113588 A1 | 6/2006 | Wu | |
| 2006/0214221 A1 | 9/2006 | Challa et al. | |
| 2006/0226494 A1 | 10/2006 | Hshieh | |
| 2006/0273383 A1 | 12/2006 | Hshieh | |
| 2007/0007589 A1 | 1/2007 | Nakagawa | |
| 2007/0013000 A1 | 1/2007 | Shiraishi | |
| 2007/0048909 A1 | 3/2007 | Sridevan | |
| 2007/0138546 A1 | 6/2007 | Kawamura et al. | |
| 2007/0145514 A1 | 6/2007 | Kocon | |
| 2007/0228496 A1 | 10/2007 | Rochefort et al. | |
| 2007/0249142 A1 | 10/2007 | Hisanaga | |
| 2007/0272977 A1 | 11/2007 | Saito et al. | |
| 2008/0099344 A9 | 5/2008 | Basol et al. | |
| 2008/0135931 A1 | 6/2008 | Challa et al. | |
| 2008/0164517 A1 | 7/2008 | Ohta et al. | |
| 2008/0173969 A1 | 7/2008 | Hebert et al. | |

(56) References Cited

U.S. PATENT DOCUMENTS

| | | |
|---|---|---|
| 2008/0185640 A1 | 8/2008 | Nakagawa |
| 2008/0185643 A1 | 8/2008 | Hossain |
| 2008/0246081 A1 | 10/2008 | Li et al. |
| 2009/0140327 A1 | 6/2009 | Hirao et al. |
| 2009/0159963 A1 | 6/2009 | Yamaguchi et al. |
| 2009/0166721 A1 | 7/2009 | Denison et al. |
| 2009/0166740 A1 | 7/2009 | Bhalla et al. |
| 2009/0302376 A1 | 12/2009 | Inoue et al. |
| 2010/0055892 A1 | 3/2010 | Poelzl |
| 2010/0059797 A1 | 3/2010 | Ngai et al. |
| 2010/0181606 A1 | 7/2010 | Takaishi |
| 2011/0049614 A1 | 3/2011 | Gao et al. |
| 2011/0053326 A1 | 3/2011 | Gao et al. |
| 2011/0233714 A1 | 9/2011 | Lu |
| 2011/0241104 A1 | 10/2011 | Willmeroth et al. |
| 2012/0112306 A1 | 5/2012 | Onishi |
| 2012/0187474 A1 | 7/2012 | Rexer et al. |
| 2012/0187477 A1 | 7/2012 | Hsieh |
| 2012/0241847 A1 | 9/2012 | Saito et al. |
| 2012/0273871 A1 | 11/2012 | Yedinak et al. |
| 2012/0273875 A1 | 11/2012 | Yedinak et al. |
| 2012/0273884 A1 | 11/2012 | Yedinak et al. |
| 2012/0313161 A1 | 12/2012 | Grivna et al. |
| 2012/0326229 A1 | 12/2012 | Poelzl et al. |
| 2013/0134500 A1 | 5/2013 | Tamaki et al. |
| 2015/0372078 A1 | 12/2015 | Pattanayak et al. |

FOREIGN PATENT DOCUMENTS

| | | |
|---|---|---|
| DE | 4208695 A1 | 9/1992 |
| DE | 102004036330 A1 | 3/2005 |
| DE | 10343084 | 5/2005 |
| DE | 112005003584 T5 | 4/2008 |
| EP | 0133642 A1 | 3/1985 |
| EP | 0354449 A2 | 2/1990 |
| EP | 0438700 A1 | 7/1991 |
| EP | 0583022 A2 | 2/1994 |
| EP | 0628337 A1 | 12/1994 |
| EP | 0746030 A2 | 12/1996 |
| EP | 1033759 A2 | 9/2000 |

OTHER PUBLICATIONS

Hattori, et al.; Design of a 200V Super Junction MOSFET with N-Buffer Regions and its Fabrication by Trench Filling; Proceedings of 2004 International Symposium on Power Semiconductor Devices & ICs, Kitakyushu; 2004.

Session I, Boston, MA, Dec. 1, 1986, Lawrence Berkeley Laboratory Jniversity of California, Berkeley, California, LBL-22577.

Y. C. Pao et al., "(110)-Oriented GaAs MESFET's", IEEE Electron Device Letters, vol. 9, No. 3, pp. 119-121, Mar. 1988.

Masakatsu Hoshi et al., "A DMOSFET Having a Cell Array Field Ring for Improving Avalanche Capability", May 18, 1993, IEEE, Proceedings of the 5th International Symposium on Power Semiconductor Devices and ICs (ISPSD), Monterey, California, May 18-20, 1993, pp. 141-145, XP000380145.

\* cited by examiner

MOSFET ACTIVE AREA AND EDGE TERMINATION AREA CHARGE BALANCE

CROSS REFERENCE TO RELATED US APPLICATIONS

This is a Divisional application of U.S. patent application Ser. No. 12/203,846, now U.S. Pat. No. 9,484,451, filed Sep. 3, 2008, which in turn claimed benefit to provisional patent application, Ser. No. 60/997,945, filed Oct. 5, 2007, entitled, MOSFET ACTIVE AREA AND EDGE TERMINATION AREA CHARGE BALANCE, and assigned to the assignee of the present invention and which is also hereby incorporated herein in its entirety by reference.

FIELD OF THE INVENTION

The present invention relates to MOSFET active area and edge termination area charge balance.

BACKGROUND

A metal-oxide semiconductor field-effect transistor (MOSFET) is a type of field-effect transistor that functions by electronically varying the width of the MOSFET channel along which charge carriers flow. The wider the MOSFET channel, the better the MOSFET can conduct. MOSFETs include gate, drain and source components. Charge carriers enter the channel via the source, and exit via the drain. The width of the MOSFET channel can be controlled by varying the voltage that is placed onto a gate electrode. In conventional MOSFETs the gate electrode is generally insulated from the channel by a thin layer of oxide.

MOSFET operational parameters affect the operation and performance of the MOSFET. MOSFET operational parameters include drain-source breakdown voltage (BVds) and drain-source on resistance (RDSon).

The MOSFET BVds is the minimum voltage that causes a portion of an insulator to become electrically conductive. Thus, generally a high BVds is desirable. Importantly, when the BVds is exceeded, current flow can occur which can prevent the MOSFET from shutting off properly. RDSon is the drain-source resistance at a specified drain current and gate-source voltage. In many applications a low RDSon is desirable and is associated with an increased MOSFET current carrying capability.

MOSFET designers often make tradeoffs between BVds and RDSon. For example, increasing the BVds by incorporating a thicker and lower doped drift region results in a higher RDSon. However, lowering RDSon by incorporating a thinner and higher doped drift region decreases BVds. Accordingly, by considering tradeoffs, designers seek to find the optimal BVds and RDSon for a MOSFET. Due to different trench widths used in the active and the trench edge termination area, it is difficult to achieve similar BVds both on the active area and on the edge termination area.

FIG. 1A shows a conventional MOSFET that includes active 101 and edge termination 103 areas. As is illustrated in FIG. 1A, the desired direction of current flow is vertical through the MOSFET (see dotted line representing the vertical channel 105 next to active area trench 107). However, if BVds is exceeded, then breakdown can occur in the oxide that lines the corners of device trenches, and undesirable current flow can occur in the MOSFET. This is because many conventional MOSFETs exhibit uneven electric fields where the strength of the electric field can be greatest at corners of MOSFET trenches.

FIG. 1B shows trench locations 111, 113 and 115 that are vulnerable to breakdown in the oxide that lines the walls of the edge termination area trenches 109 of the conventional MOSFET shown in FIG. 1A. As discussed above, such current flow can prevent a MOSFET from shutting off properly. Importantly, many conventional MOSFETs are provided with inadequate protection against edge termination area voltage breakdown and are susceptible to such current flow.

SUMMARY OF THE INVENTION

Accordingly, a need exists for a method of providing MOSFETs with improved protection from voltage breakdown and undesirable current flow. The present invention provides a method that accomplishes this need.

Embodiments of the present invention enable the optimization of breakdown voltage (BVds) in both the active and edge termination areas of a MOSFET by making tuned implants at trench bottoms in both areas that result in a charge balanced implant region. The charge balance results in a flat electric field across the implant region that supports higher breakdown voltages (BVds). Moreover, the higher doping concentration that results from implants made in the active region advantageously lowers device on resistance (RDSon) of the MOSFET.

As a part of a disclosed method for providing charge balanced active and edge termination areas for a MOSFET, a first plurality of implants are formed at the bottom of trenches located in an active area and in an edge termination area of a MOSFET. Subsequently, a second plurality of implants is formed at the bottom of the trenches located in the active area only. The second plurality of implants formed at the bottom of the trenches located in the active area of the MOSFET causes the implants formed at the bottom of the trenches located in the active area to reach a desired concentration.

In one embodiment, a disclosed method for fabricating a MOSFET having an active area and an edge termination area includes forming first and second epitaxial layers on a substrate, forming trenches in the active area and in the edge termination area in the topmost of the epitaxial layers, and forming multiple implants at the bottom of the trenches formed in the active area and in the edge termination area. Moreover, the method includes masking the edge termination area, forming multiple implants at the bottom of the trenches formed in the active area and forming a thick oxide layer on the edge termination area. A layer of oxide formed in the trenches located in the edge termination area is thicker than a layer of oxide formed in the trenches located in the active area.

Also disclosed is a MOSFET that includes an active area and an edge termination area with both areas having similar BVds. In one embodiment, the active area includes a plurality of active area trenches, a source region adjacent one or more sidewalls of the plurality of trenches, a gate region located adjacent to and vertically underneath the source region, and a drain region located adjacent to and vertically underneath the gate region. The edge termination area includes a gate pickup trench and a plurality of termination trenches. A first plurality of implants is provided at the bottom of the trenches located in both the active area and the edge termination area. A second plurality of implants are formed at the bottom of the trenches located in the active area and causes the implants formed at the bottom of the trenches located in the active area to reach a predetermined desired concentration. The MOSFET may advantageously have optimized BVds in both the active and edge termination areas.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION OF THE INVENTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Figure 1A:
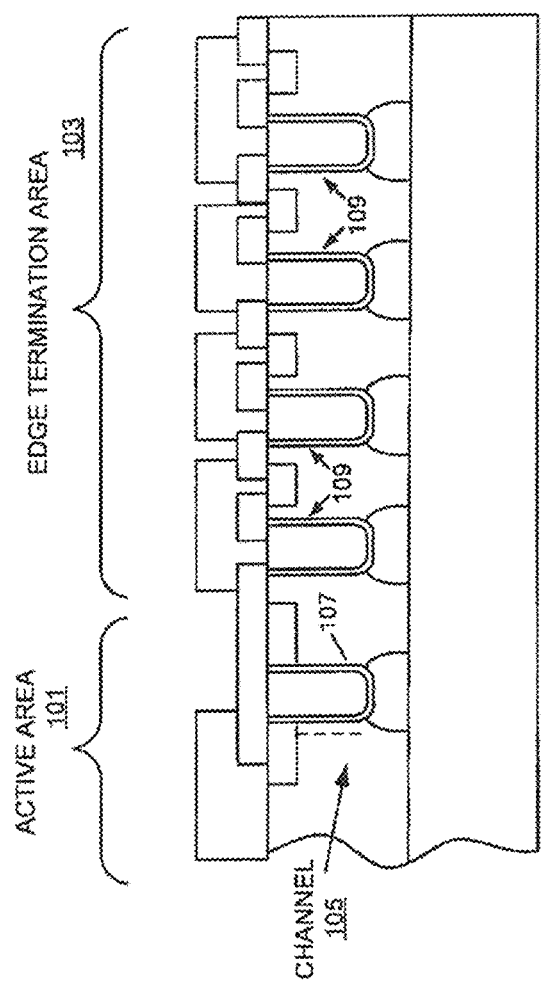
FIG. 1A shows a conventional metal oxide semiconductor field effect transistor (MOSFET) device that includes active and edge termination areas.
Figure 1B:
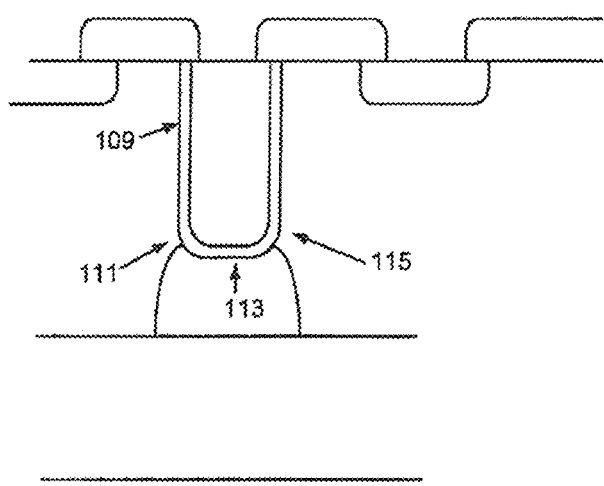
FIG. 1B shows vulnerable locations in the oxide that lines the walls of edge termination area trenches of the conventional MOSFET shown in FIG. 1B.
Figure 2A:
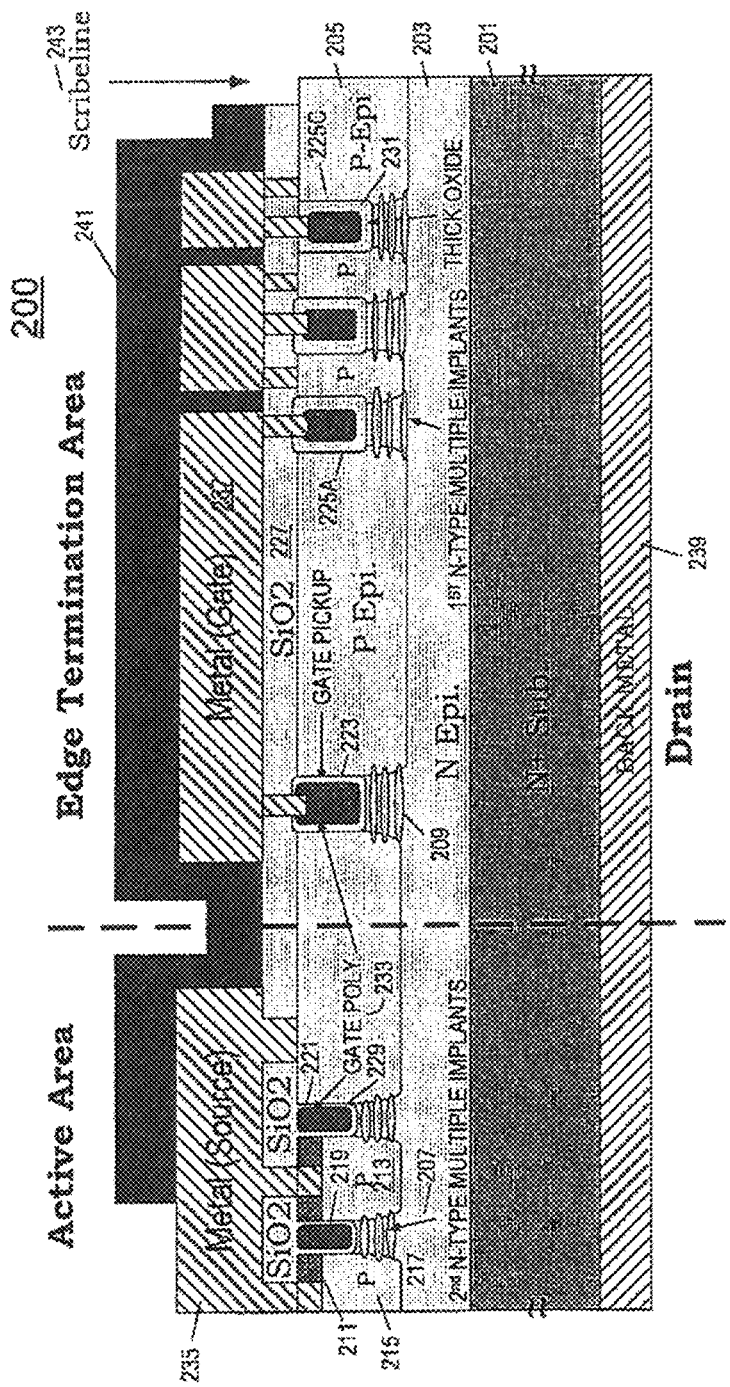
FIG. 2A shows a cross section of a MOSFET formed according to one embodiment of the invention.

MOSFET Active Area and Edge Termination Area Charge Balance According to One Embodiment of the Present Invention FIG. 2A shows a cross section of a MOSFET 200 formed according to one embodiment of the invention. In accordance with embodiments of the present invention, multiple implants are made to MOSFET 200 active area 200a and edge termination area 200b trench bottoms to achieve charge balance between these areas. In one embodiment, this charge balance provides MOSFET 200 with breakdown voltages (BVds) that are similar in each area and moreover, the BVds may be optimized in both areas. Moreover, the higher doping concentration provided by the implants results in lowered MOSFET 200 on-resistance (RDSon). Additionally, the charge balance causes the electric field across the implant region to be flat which supports an attainment of a higher BVds for MOSFET 200 as compared with MOSFETs that do not feature a charge balanced implant region.

In the FIG. 2A embodiment, MOSFET 200 includes substrate 201, epitaxial (epi) layer 203, epitaxial (epi) layer 205, multiple active area implants 207, multiple edge termination area implants 209, source implants 211, P body well 213, gate region 215, drain region 217, active area trench 219, active area trench 221, gate pickup trench 223, edge termination area trenches 225a-225c, oxide layer 227, active area trench oxide 229, edge termination area trench oxide 231, gate poly 233, source electrode 235, gate electrode 237, drain electrode 239, passivation layer 241 and scribeline 243.

Referring to FIG. 2A, multiple implants 207 and 209 are formed at the bottom of active area 200a and edge termination area 200b trenches 219, 221, 223 and 225a-225c in accordance with processes described herein (see discussion made with reference to FIGS. 3A-3H). In the FIG. 2A embodiment, the implants made at the bottom of active area trenches 219 and 221 form portions of the drain region of MOSFET 200. In one embodiment, the formation of these implants can be completed in two implantation operations. Initially, multiple implants are formed at the bottom of both active area trenches 219 and 221 and edge termination area trenches 223 and 225a-225c. Thereafter, second multiple implants are made at the bottom of active area trenches 219 and 221.

In one embodiment, the second multiple implants made at the bottom of active area trenches 219 and 221 are added to the first multiple implants that are made at the bottom of active area trenches 219 and 221 in the first implantation operation. The second multiple implants are used to advantageously "tune" or adjust the implants that are made at the bottom of active area trenches 219 and 221, in the first multiple implant operation, to a desired doping concentration. In one embodiment, the implants are tuned to achieve a charge balance between the active area 200a and the edge termination area 200b of device 200. The charge balance thus achieved between the active area 200a and the edge termination area 200b supports a higher BVds. In this manner, the BVds can be optimized in both areas 200a and 200b.

Figure 2B:
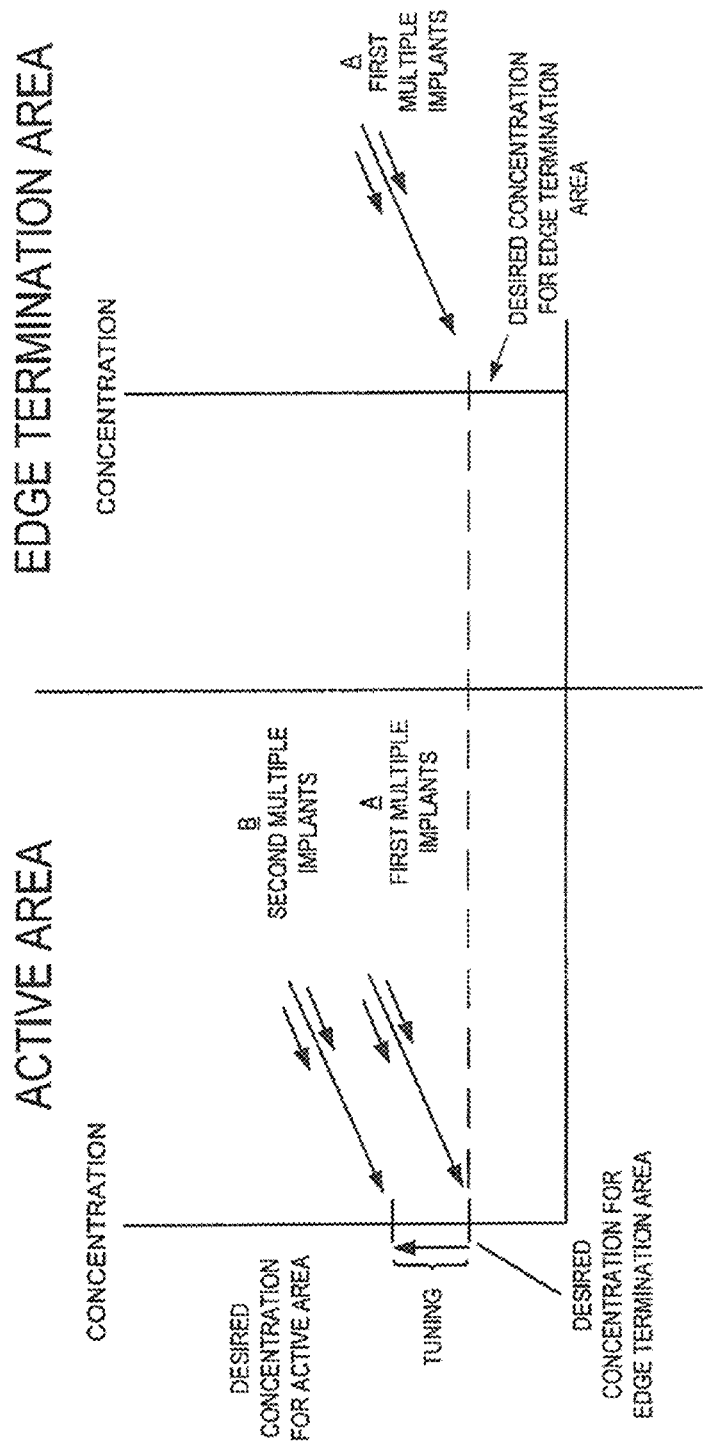
FIG. 2B illustrates tuning operations of an implantation process for achieving charge balance between active and edge termination areas according to one embodiment of the present invention.

FIG. 2B illustrates tuning operations of an implantation process for achieving the aforementioned charge balance according to one embodiment of the present invention.

Referring to FIG. 2B, at A when the first plurality of implants are made at the bottom of trenches located in both the active area 200a and the edge termination area 200b, the doping concentration of implants located at the bottom of the trenches reach a level that is optimal for edge termination area trenches 223 and 225a-225c. At B when the second plurality of implants are made at the bottom of active area trenches 219 and 221, the second plurality of implants serve to "tune" the doping concentration of implants located at the bottom of active area trenches 219 and 221 to a concentration that is optimal for the active area trenches while leaving alone the trenches of the termination area.

The implantation energies used to make the implants can be selected to achieve the desired doping concentration for the implants. In one embodiment, for a hard mask thickness of 8 kilo angstroms (see discussion below) implantation energies can include but are not limited to 150, 350 and 450 ev in one example. In other embodiments, other implantation energies can be employed.

Referring again to FIG. 2A, MOSFET 200 is provided with an edge termination structure that includes edge termination trenches 225a-225c. In one embodiment, this structure is provided in order to prevent voltage breakdown or current leakage via paths created when the MOSFET 200 die is cut at scribeline 243. The plurality of trenches 225a-225c that are a part of the edge termination structure distribute or step down the source to drain voltage which lessens the risk of voltage breakdown.

In one embodiment, edge termination trench oxide 231 is formed to have a greater thickness than the thickness of active area trench oxide 229. The thickness of edge termination area trench oxide 231 enables the support of larger reverse bias voltages in the off-state than could be supported by a less thick oxide layer. In one embodiment, a 1.5 kilo angstrom thickness can be employed in forming this layer of oxide. In other embodiments, other thicknesses can be employed. This thick oxide layer, by enabling the support of larger reverse bias voltages, provides protection against voltage breakdown.

In operation, when a turn-on voltage is applied to gate electrode 237 the voltage is coupled to active area trenches 219 and 221 through gate pickup trench 223 and causes current to flow through a channel formed adjacent to active area trench 219. When a turn-off voltage is applied to gate electrode 237, high turn-off voltage differences are robustly supported by thick oxide 231 that surrounds the edge termination area trenches 225a-225c. As discussed above, this thick oxide helps to prevent breakdown where undesirable conduction such as a sudden flow of current can occur.

In one embodiment, the high doping concentration provided by multiple implants reduces electrical resistance for electron flow and thus lowers RDSon. Moreover, the charge balanced active and edge termination areas, 200a and 200b, that are provided by the multiple implants allow a full depletion of charge from the implant region in the off state, which supports high voltage conditions during off state. In contrast, during conduction state, the higher doping of the MOSFET drift region provided by multiple active area implants 207 allows easier flow of carriers thereby advantageously reducing RDSon.

The tuned implantation approach of the present invention allows the implants made to be tuned to a precise doping concentration needed for trenches of the particular widths used. It is appreciated that in this manner charge balance can be achieved despite the presence of trenches of different widths in the device. Moreover, in one embodiment, vertical current flow is maintained in active area 200a while undesirable current flow and voltage breakdown in edge termination area 200b is avoided.

In one embodiment, MOSFET 200 can be made with P epi layer/N epi layer/N+ substrate for N-channel devices and N epi layer/P epi layer/P+ substrate for P-channel devices. In order to achieve a desirable Rdson and a high BVds, MOSFET 200 multiple implants 207 and 209 are made at levels that are optimal for a desired BVds through trench bottoms to achieve charge balance over the entire implant region of the device as is discussed above. In exemplary embodiments, separate multiple implants between active area 200a trench bottom and edge termination 200b trench bottom provide optimized BVds on both areas.

Process Flow for MOSFET Active Area and Edge Termination Area Charge Balance

FIGS. 3A-3I show a series of cross sections illustrating an exemplary process for providing MOSFET active area and edge termination area charge balance using multiple implants according to one embodiment of the invention. Structures similar to those shown in FIG. 2A are similarly labeled in FIGS. 3A-3I.

Figure 3A:
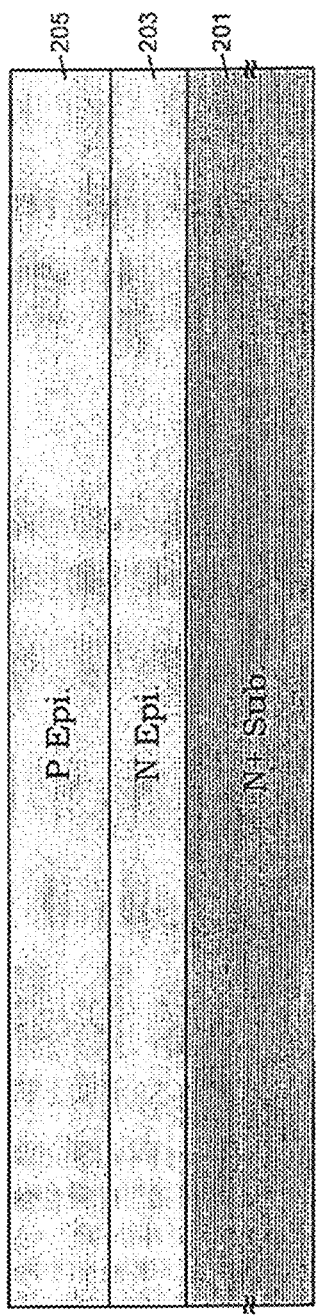
FIG. 3A shows an N epi-layer and a P epi-layer formed on an N+ substrate according to one embodiment of the present invention.
Figure 3B:
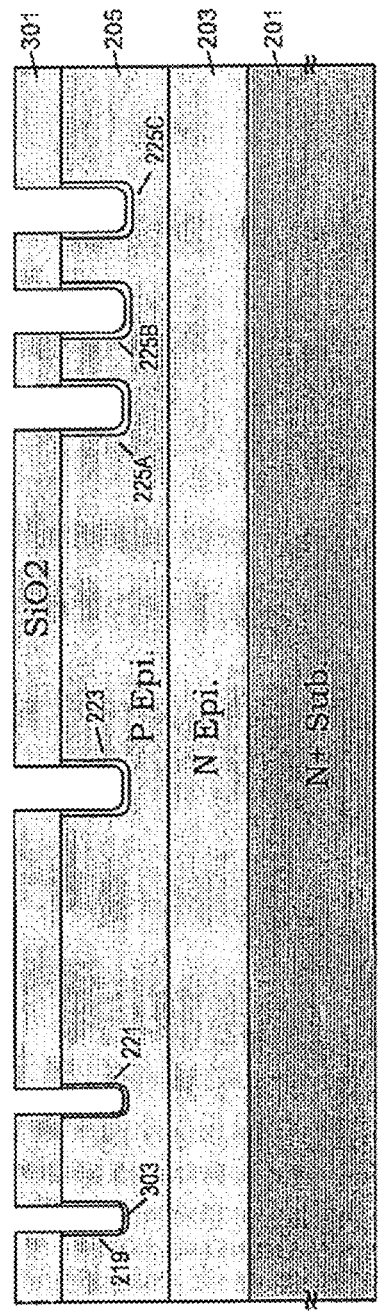
FIG. 3B shows active area and edge termination area trenches formed in a P epi-layer according to one embodiment of the present invention.

As shown in FIG. 3A, in initial operations N epi-layer 203 and P epi-layer 205 are formed on N+ substrate 201. As shown in FIG. 3B, subsequent to one or more operations that result in the cross section shown in FIG. 3A, active area and edge termination area trenches 219, 221, 223 and 225a-225c are formed in P epi-layer 205. In one embodiment, a hard mask 301 is used to define the locations of the trenches. In one embodiment, hard mask 301 can be formed from low thermal oxide, LTO, SiO2. In other embodiments, other substances can be used to form hard mask 301. In one embodiment, the locations of the openings in hard mask 301 that define the locations of active area 200a and edge termination area 200b trenches can be defined using photoresist (not shown). In one embodiment, the trenches are formed by a plasma etching process. In another embodiment, other processes can be used. The thickness of the trench can be controlled by the amount of implant energy used when plasma etching is employed.

Moreover, referring again to FIG. 3B, an oxide layer 303 is formed on the bottom and sidewalls of the trenches. In one embodiment, oxide layer 303 formed on the bottom and sidewalls of the trenches may be formed from SiO2. In one embodiment, the oxide may be formed using low thermal oxide (LTO) processes.

Figure 3C:
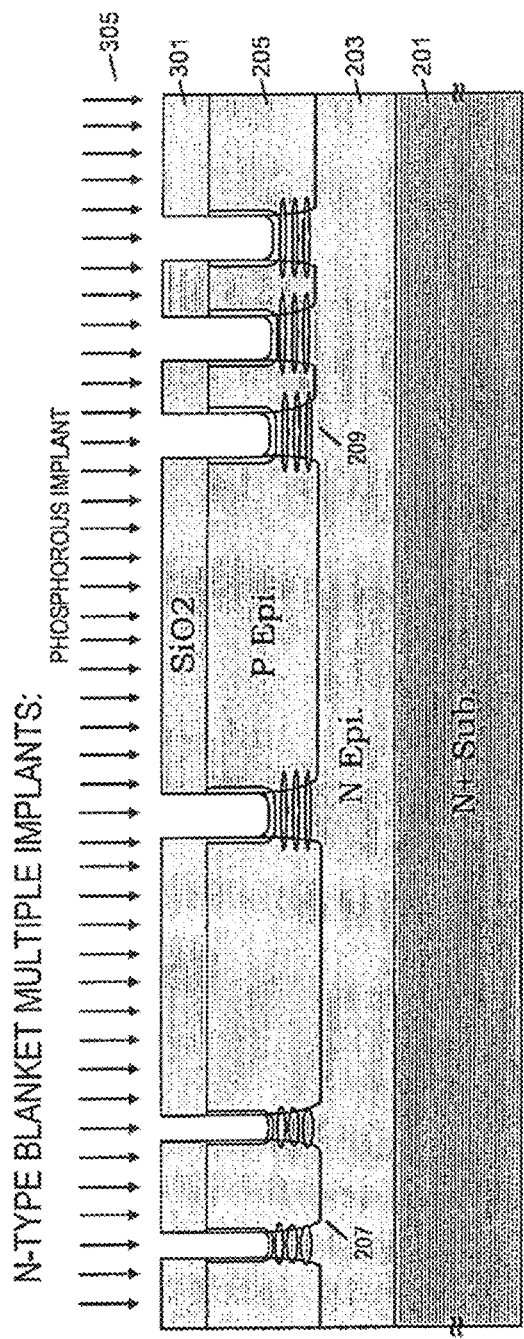
FIG. 3C shows first N-type multiple implants made at the bottom of active area and edge termination area trenches according to one embodiment of the present invention.

As shown in FIG. 3C, subsequent to one or more operations that result in the cross section shown in FIG. 3B, first N-type multiple implant operation 305 is used to make first N-type multiple implants at the bottom of active area and edge termination area trenches (e.g., 207 and 209). Referring to FIG. 3C, although the implants may be provided in a blanket manner parallel to the device surface, hard mask 301 (by selectively blocking the implants) ensures that the implants are implanted in desired locations at the bottom of the trenches (e.g., 207 and 209). In one embodiment, first N-type multiple implant operation 305 may use phosphorous implants. In other embodiments, other substances may be used.

In one embodiment, the implant energy that is used to make the implants at the bottom of the trenches depends on the desired breakdown voltage. Moreover, the dosage of the implants depends on the width of the associated trench. In one embodiment, for an 8K angstrom hard mask implant energies can include but are not limited to 150, 350 and 450 ev, for instance.

Figure 3D:
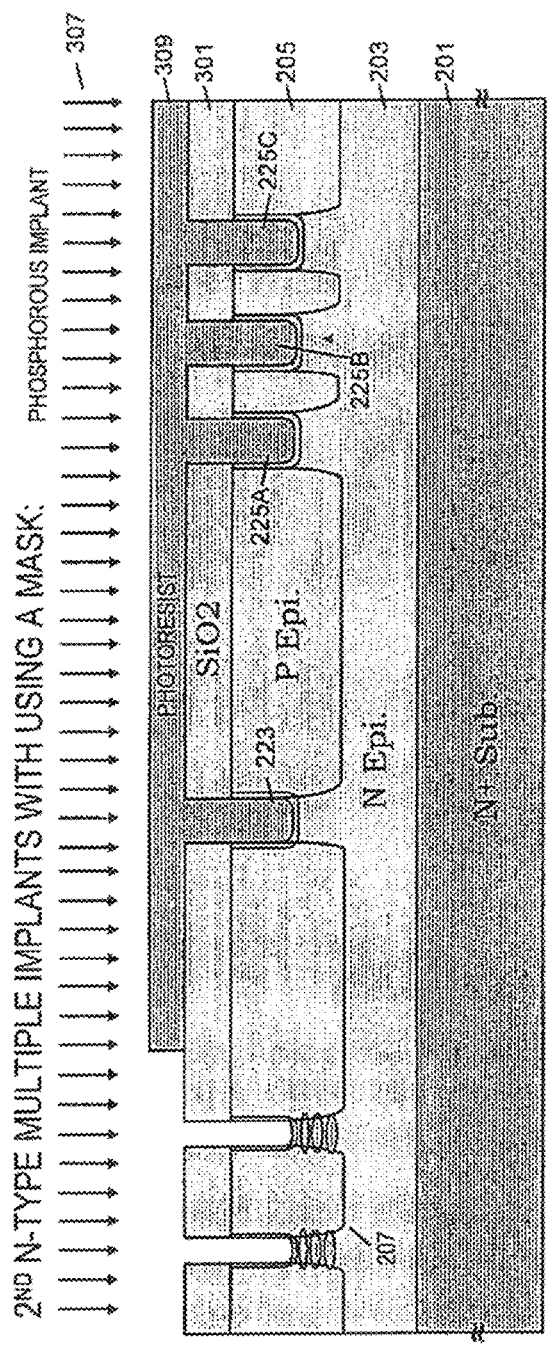
FIG. 3D shows second N-type multiple implants made at the bottom of active area trenches according to one embodiment of the present invention.

As shown in FIG. 3D, subsequent to the execution of one or more operations that result in the cross section shown in FIG. 3C, second N-type multiple implants operation 307 is used to make second N-type multiple implants at the bottom of active area trenches (e.g., 207). In one embodiment, the second N-type multiple implants are used to tune the implants already made at the bottom of active area trenches 219 and 221 to a desired concentration. In one embodiment, a photoresist mask 309 can be used to cover edge termination area 200b before the implantation of second N-type multiple implants 307, such that second N-type multiple implants 307 are prevented from implantation at the bottom of edge termination area trenches 223, 225a, 225b and 225c.

In one embodiment, second N-type multiple implant operation 307 can use phosphorous implants. In other embodiments, other substances may be used in second N-type multiple implant operation 307. In one embodiment, a photoresist mask 309 can be formed to cover each of the trenches except active area trenches 219 and 221. In one embodiment, the implant energy may depend on the desired breakdown voltage and the dosage may depend on trench width.

Figure 3E:
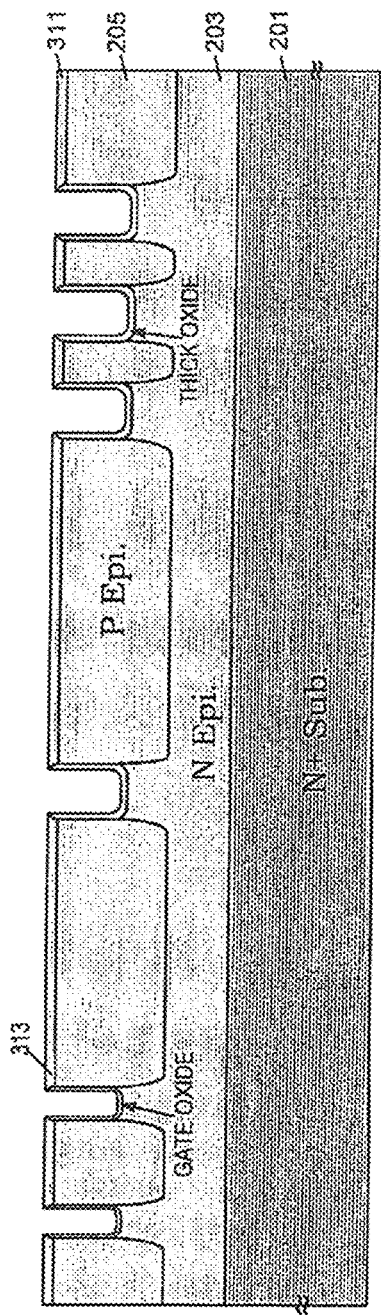
FIG. 3E shows a thick oxide layer grown on a termination trench area that is formed using a mask and a gate oxide layer grown on active area according to one embodiment of the present invention.

As shown in FIG. 3E, subsequent to the execution of one or more operations that results in the cross section shown in FIG. 3D, thick oxide 311 is grown on edge termination trench area using a mask (not shown) and a gate oxide 313 is grown on active area. In one embodiment, this may be accomplished by: (1) growing a thick oxide layer on the entire surface of the device and in trenches, (2) masking the surface of the device and trenches in the edge termination region and then removing the thick oxide layer from the remainder of the surface and trenches, and (3) thereafter reapplying a thin oxide layer on the remainder of the surface and trenches. In other embodiments, other techniques for forming thick 311 and thin oxide 313 layers can be used.

In one embodiment, thick oxide layer 311 can be grown to a 1.5 Kilo-angstrom thickness. In other embodiments, thick oxide layer 311 can be grown to other thicknesses. In one embodiment, thin oxide layer 313 can be grown to a 100 angstrom thickness. In other embodiments, thin oxide layer 313 can be grown to other thicknesses.

Figure 3F:
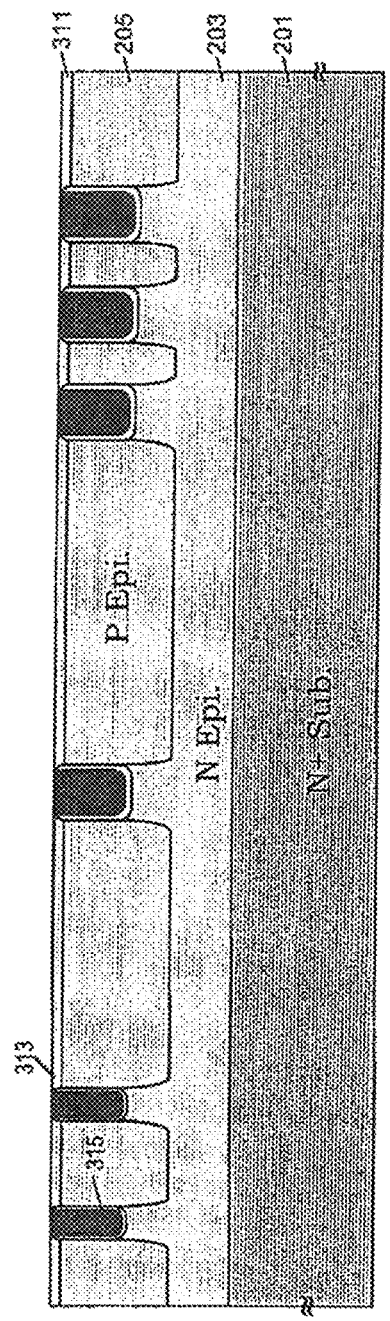
FIG. 3F shows a deposition of polysilicon formed in active area and edge termination area trenches according to one embodiment of the present invention.

As shown in FIG. 3F, subsequent to the execution of one or more operations that result in the cross section shown in FIG. 3E, a deposition of polysilicon 315 into active area 200a and edge termination area 200b trenches 219, 221, 223 and 225a-25c is performed. Thereafter, a doping of deposited polysilicon 315 is performed. Subsequently, a polysilicon etch-back or chemical mechanical polishing (CMP) of deposited polysilicon 315 is performed.

Figure 3G:
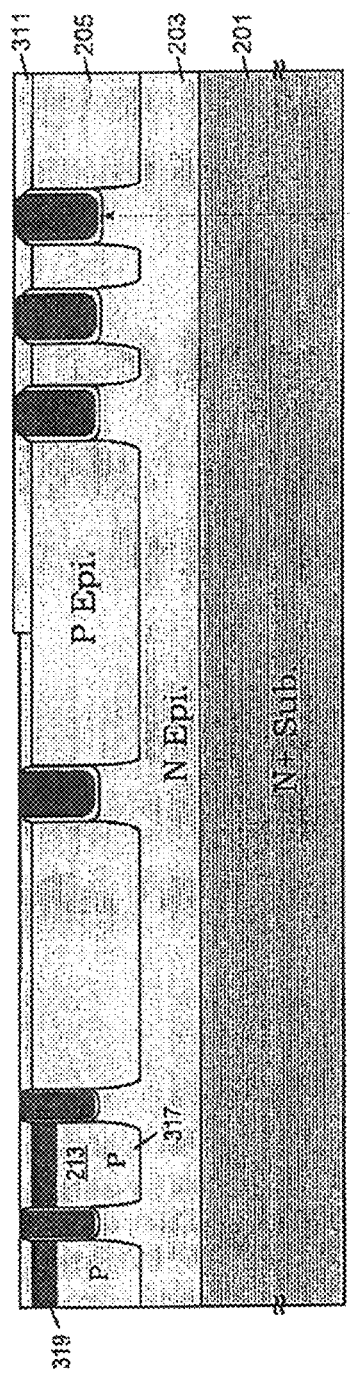
FIG. 3G shows a threshold voltage (Vt) adjustment implant and a source implant according to one embodiment of the present invention.

As shown in FIG. 3G, subsequent to the execution of one or more operations that result in the cross section shown in FIG. 3F, threshold voltage (Vt) adjustment implant 317 and source implant 211 is made. In one embodiment a source mask (not shown) can be used to make Vt adjustment implant 317 and source implant 211. In one embodiment, Vt adjustment implant 317 can include a P type implant made to the P body well 213 formed in P epi layer 205. This implant is used to tune the P type impurities located in the region to a desired level by adding to the P type impurities already present. In one embodiment, by making tuning P type implants that adjust the doping concentration in the region, the threshold voltage may be adjusted to a desired level.

Figure 3H:
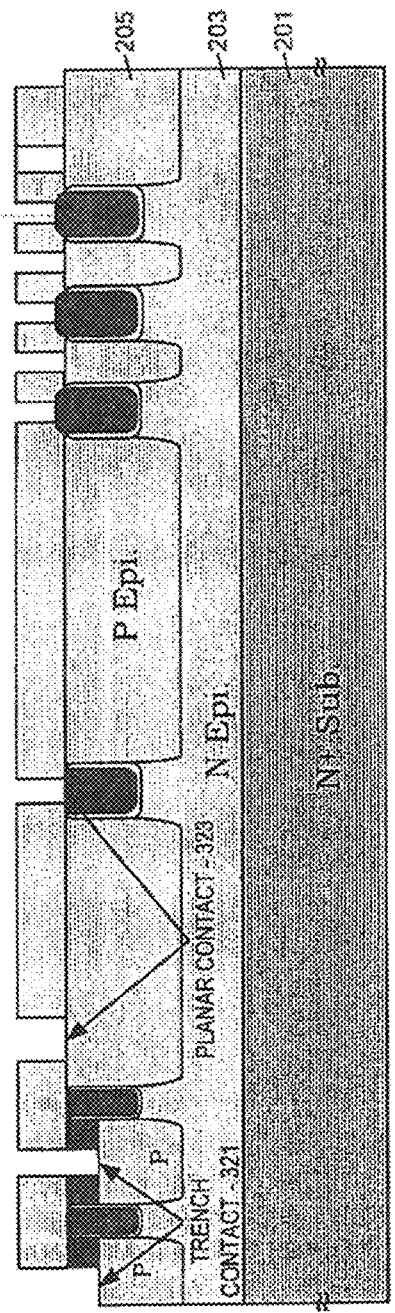
FIG. 3H shows a device cross section after low thermal oxide (LTO) and borophosphosilicate glass (BPSG) deposition according to one embodiment of the present invention.

As shown in FIG. 3H, subsequent to the execution of one or more operations that result in the cross section shown in FIG. 3G, low thermal oxide (LTO) and borophosphosilicate glass (BPSG) deposition is performed. Thereafter, planar contacts 323 and trench contacts 321 are formed. Planar contacts 323 are contacts that allow contact at the surface of the device. Trench contacts 321 are contacts that allow contact through trenches made in the surface of the device.

Figure 3I:
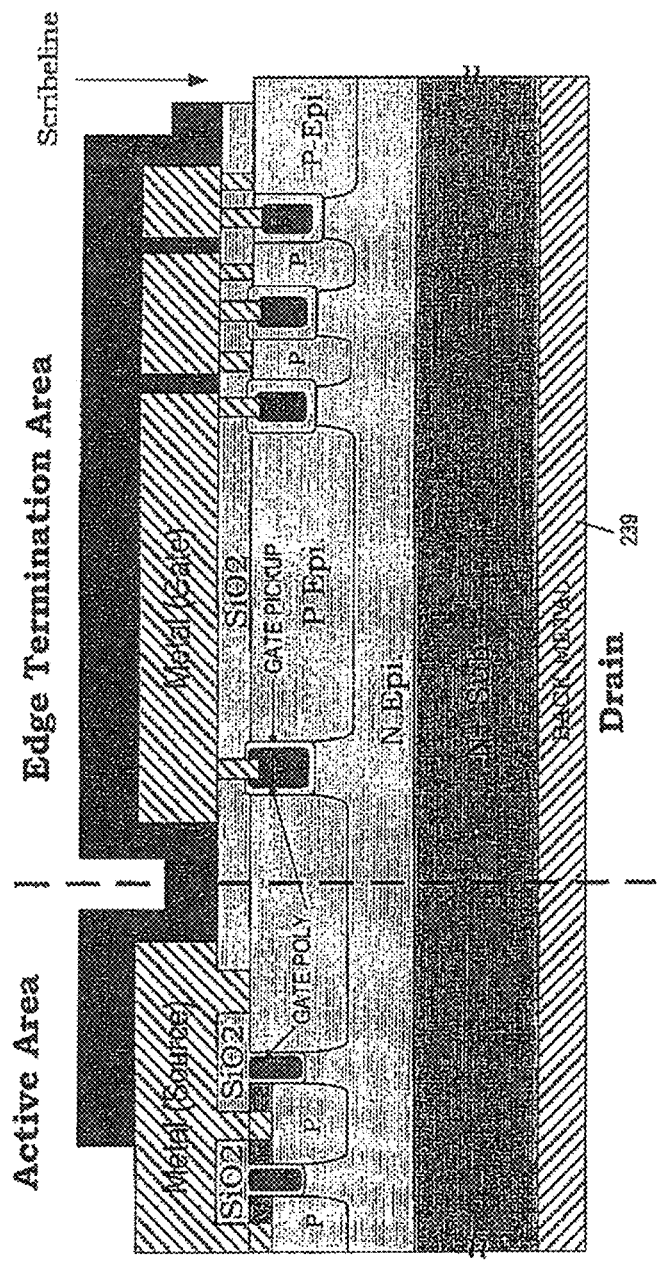
FIG. 3I shows a device cross section after contact implants and metallization and passivation layers are formed according to one embodiment of the present invention.

As shown in FIG. 3I, subsequent to the execution of one or more operations that result in the cross section shown in FIG. 3H, contact implants, metallization and passivation can be performed. These operations provide source, gate and drain electrodes that allow the application of voltages, grounding etc. And, result in the completed structure shown in FIG. 3I.

With reference to exemplary embodiments thereof, a method for fabricating a MOSFET having an active area and an edge termination area is disclosed. The method includes forming a first plurality of implants at the bottom of trenches located in the active area and in the edge termination area. A second plurality of implants is formed at the bottom of the trenches located in the active area. The second plurality of implants formed at the bottom of the trenches located in the active area causes the implants formed at the bottom of the trenches located in the active area to reach a predetermined concentration.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

We claim:

1. A semiconductor device, comprising:
   an active area, comprising:
      a plurality of active area trenches;
      a source region adjacent one or more sidewalls of said plurality of active area trenches;
      a gate region located adjacent to and vertically underneath said source region; and
      a drain region located adjacent to and vertically underneath said gate region;
   and
   an edge termination area, comprising:
      a gate pickup trench; and
      a plurality of edge termination area trenches,
   wherein a first plurality of implants are made at the bottom of trenches formed in both said active area and said edge termination area, and wherein a second plurality of implants are made at said bottom of said trenches formed in said active area and causes said implants made at the bottom of said trenches formed in said active area to reach a predetermined concentration.

2. The device of claim 1 further comprising:
   a layer of oxide formed in said plurality of active area trenches; and a layer of oxide formed in said plurality of edge termination area trenches, wherein said layer of oxide formed in said plurality of edge termination area trenches is thicker than the layer of oxide formed in said plurality of active area trenches.

3. The device of claim 2 further comprising:
a plurality of edge termination contacts in said edge termination area.

4. The device of claim 1 wherein said first and said second plurality of implants results in a simultaneous charge balance within said active area and within said edge termination area.

5. The device of claim 1 wherein said first and said second plurality of implants are phosphorous implants for N-channel devices and boron implants for P-channel devices.

6. The device of claim 1 wherein said layer of oxide formed in said active area trenches and said edge termination area trenches are formed using a low thermal oxide (LTO) process.

7. The device of claim 1 wherein said active area trenches and said edge termination area trenches are filled with doped polycrystalline.

8. The device of claim 1 wherein said source is formed over a body well comprising a voltage adjustment implant.

9. The device of claim 1 further comprising planar contacts and trench contacts that are filled with metal.

10. A semiconductor device, comprising:
an active area, comprising:
a plurality of active area trenches;
a source region adjacent one or more sidewalls of said plurality of active area trenches;
a gate region located adjacent to and vertically underneath said source region; and
a drain region located adjacent to and vertically underneath said gate region;
and
an edge termination area, comprising:
a gate pickup trench; and
a plurality of edge termination area trenches,
wherein a first plurality of implants are made at the bottom of trenches formed in both said active area and said edge termination area, and wherein a second plurality of implants are made at said bottom of said trenches formed in said active area.

11. The device of claim 10 further comprising:
a layer of oxide formed in said plurality of active area trenches; and
a layer of oxide formed in said plurality of edge termination area trenches, wherein said layer of oxide formed in said plurality of edge termination area trenches is thicker than the layer of oxide formed in said plurality of active area trenches.

12. The device of claim 11 further comprising:
a plurality of edge termination contacts in said edge termination area.

13. The device of claim 10 wherein said first and said second plurality of implants results in a simultaneous charge balance within said active area and within said edge termination area.

14. The device of claim 1 wherein said first and said second plurality of implants are phosphorous implants for N-channel devices and boron implants for P-channel devices.

15. A semiconductor device, comprising:
an active area, comprising:
a plurality of active area trenches;
and
an edge termination area, comprising:
a plurality of edge termination area trenches,
wherein a first plurality of implants are made at the bottom of trenches formed in both said active area and said edge termination area, and wherein a second plurality of implants are made at said bottom of said trenches formed in said active area.

16. The device of claim 15 further comprising:
a layer of oxide formed in said plurality of active area trenches; and
a layer of oxide formed in said plurality of edge termination area trenches, wherein said layer of oxide formed in said plurality of edge termination area trenches is thicker than the layer of oxide formed in said plurality of active area trenches.

17. The device of claim 15 wherein said active area trenches and said edge termination area trenches are filled with doped polycrystalline.

18. The device of claim 15 further comprising a source formed over a body well comprising a voltage adjustment implant.

19. The device of claim 15 further comprising planar contacts and trench contacts that are filled with metal.

20. The device of claim 1 wherein said first and said second plurality of implants are phosphorous implants for N-channel devices and boron implants for P-channel devices.

* * * * *